United States Patent [19]
Wallnöfer et al.

[11] Patent Number: 5,369,327
[45] Date of Patent: Nov. 29, 1994

[54] PIEZOELECTRIC CRYSTAL ELEMENT

[75] Inventors: Wolfgang Wallnöfer, Graz; Peter W. Krempl, Graz/Ragnitz, both of Austria

[73] Assignee: AVL Gesellschaft Für Verbrennungskraftmaschinen und Messtechnik m.b.H Prof.Dr.Dr.h.c. Hans List, Graz, Austria

[21] Appl. No.: 197,805

[22] Filed: Feb. 17, 1994

[30] Foreign Application Priority Data

Mar. 4, 1993 [AT] Austria .................................. 422/93

[51] Int. Cl.$^5$ .......................................... H01L 41/08
[52] U.S. Cl. ................... 310/313 A; 310/360; 374/117
[58] Field of Search .................... 310/360, 313 A; 374/117

[56] References Cited

U.S. PATENT DOCUMENTS

| | | | |
|---|---|---|---|
| 4,026,994 | 5/1977 | Tashiro et al. | 423/299 |
| 4,109,172 | 8/1978 | O'Connell | 310/313 A |
| 4,324,773 | 4/1982 | Chai et al. | 423/311 |
| 4,382,840 | 5/1983 | Chai et al. | 156/623 R |
| 4,481,069 | 11/1984 | Chai et al. | 156/623 R |
| 4,554,136 | 11/1985 | Chai et al. | 422/209 |
| 4,559,208 | 12/1985 | Chai et al. | 422/209 |
| 4,578,146 | 3/1986 | Chai et al. | 422/209 |
| 4,992,694 | 2/1991 | Gunter et al. | 310/360 |
| 5,275,697 | 1/1994 | Philippot et al. | 156/667 |

FOREIGN PATENT DOCUMENTS 390853 7/1990 Austria .
0069112 5/1986 European Pat. Off. .

*Primary Examiner*—Mark O. Budd
*Attorney, Agent, or Firm*—Watson, Cole, Grindle & Watson

[57] ABSTRACT

For surface acoustic wave devices temperature-compensated piezoelectric crystal elements with one or more planar faces are used. An improvement in temperature stability may be expected if the crystal element is made from $GaPO_4$ and the planar face is defined by Euler angles $\lambda$ in the range of 0°, $\mu$ in the range of 40° to 75°, i.e. preferably 50° to 60°, and $\theta$ in the range of 0°.

9 Claims, 1 Drawing Sheet

PIEZOELECTRIC CRYSTAL ELEMENT

BACKGROUND OF THE INVENTION

The invention relates to a piezoelectric crystal element with at least one substantially planar surface, to be used in surface acoustic wave devices.

Surface acoustic waves (SAW) on piezoelectric materials are employed for signal processing in numerous components. Uses in the VHF and UHF ranges include filters, oscillators, delay lines, convolvers, and different types of sensors. The major quality criteria for SAW components, which depend on the particular type of substrate used, are temperature stability of delay time or center frequency, low insertion loss (attenuation of a signal by inserting a component into the signal path), and high bandwidth. The latter two criteria are met simultaneously only by strong piezoelectric coupling. The temperature coefficient of the delay time is determined by the difference between the temperature coefficients of phase velocity and path length. If the two effects cancel each other out a temperature-compensated cut will result. Such cuts are obtainable only with a few materials, however.

The principal substrate materials used in this context are ST quartz and lithium niobate. The former is characterized by high temperature stability and weak piezoelectric coupling. Lithium niobate, on the other hand, is characterized by very strong coupling, whereas its delay time strongly increases with temperature. As a compromise between the two requirements lithium tantalate has been used, but its temperature stability has again proved insufficient in a number of applications.

The search for materials combining strong piezoelectric coupling and satisfactory temperature stability has led to such interesting materials as berlinite ($AlPO_4$) and lithium tetraborate ($Li_2B_4O_7$). Both materials have coupling coefficients higher than that of quartz, in addition to cuts with a negligible first temperature coefficient of delay time. With either material, however, the second (quadratic) temperature coefficient is higher by more than an order of magnitude than that of ST quartz. For this reason neither of the two substrates has become widely accepted.

DESCRIPTION OF THE PRIOR ART

In U.S. Pat. No. 4,109,172, for example, a temperature-compensated berlinite wafer is proposed as a surface acoustic wave element, whose surface is defined by Euler angles $\lambda=0°$, $\mu=80.4°$, and $\theta=0°$. In EP 0 144 544 B1 a temperature-compensated orientation of a berlinite crystal is disclosed, whose planar surface is defined by Euler angles $\lambda=0°$, $\mu=$ about $94°$ to $104°$, and $\theta=0°$.

The statements above refer to the standard temperature range for military and commercial applications. The lack of suitable substrate materials is felt even more strongly in the high-temperature range of 100° to 900° C., as the temperature stability of quartz and berlinite is subject to drastic deterioration at high temperatures. The usefulness of the two materials comes to an end at the $\alpha$-$\beta$ phase transition at 573° C. and 588° C., respectively. This range would be of interest in sensor devices, however, as some of their applications are in these temperature ranges, and further, as the response time of chemical sensors based on SAW sharply decreases with temperature.

As has been described in EP-A 0 069 112, other crystals of point group 32 with the total molecular formula $ABO_4$ are characterized by a significantly higher temperature stability for essential physical properties. For instance, the low-temperature form of gallium orthophosphate ($GaPO_4$), which is homeotypical relative to quartz and isotypical relative to berlinite, has no $\alpha$-$\beta$ phase transition like quartz and berlinite, but is stable up to 930° C. A temperature-compensated orientation for resonators with a higher piezoelectric coupling coefficient than quartz is described in AT-PS 390 853, for example. Such orientations are not suitable for SAW applications, however.

SUMMARY OF THE INVENTION

It is an object of the invention to propose piezoelectric crystal elements for surface acoustic wave applications, whose temperature stability exceeds that of previous materials and is maintained even at high temperatures.

In the invention this object is achieved by using $GaPO_4$ for the crystal element and by defining the planar surface by Euler angles $\lambda$ in the range of 0°, $\mu$ in the range of 40° to 75°, i.e., preferably 50° to 60°, and $\theta$ in the range of 0°. It has been found unexpectedly that the optimum temperature-compensated range of cutting angles for SAW applications using $GaPO_4$ crystals is significantly outside of the range indicated for the most similiar material tested in this context, i.e., berlinite, whose Euler angle $\mu=80°$ to 104°. The tolerances for Euler angles $\lambda$ and $\theta$ are about ±5°.

Another advantage of the crystal element proposed by the invention is that the product of period length of the interdigital transducers and center frequency of the surface acoustic wave device is between 2,250 and 2,400 $\mu$m MHz. This product is significantly lower than for quartz and berlinite, thus permitting a more compact and economic design requiring less material for the same center frequency.

At least one face of the crystal element, i.e., the one carrying the electronic circuit, e.g. the interdigital transducers, is polished smoothly, whereas the other face is less critical and may even be roughened or not completely parallel to the first face, in order to reduce the influence of body wave reflection. It is possible, in particular, that the crystal element is essentially configured as a wafer. Thickness and contour of the wafer are not critical.

In further development of the invention the proposal is put forward that the crystal element be part of a chemical sensor and that it be covered entirely or partially by a sensitive layer and, if required, by a reference layer. The sensitive layer may be made heat resistant up to 900° C. and thus be fully cured, As regards $GaPO_4$ it has been found that the range of maximum piezoelectric coupling between $\mu=90°$ and $\mu=130°$ has a high temperature coefficient for the frequency, unlike that of berlinite. It is therefore possible to provide a temperature sensor based on a $GaPO_4$ crystal element, where the planar surface of the crystal element is defined by Euler angles $\lambda$ in the range of 0°, $\mu$ in the range of 90° to 130°, and $\theta$ in the range of 0°.

DETAILED DESCRIPTION OF THE INVENTION

The orientation of the piezoelectric crystal element 1 in a GaPO4 crystal 2 is defined by the three Euler angles $\lambda$, $\mu$ and $\theta$. These are the angles through which a system of coordinates x', y', z', whose axes originally coincide with the three crystal axes X, Y, Z, is rotated successively about its third, first and third axis. The first axis x' of the rotated system determines the direction of the phase velocity of the SAW, and the third axis z' determines the normal of the surface 3 of the crystal element 1. In so-called X-boule cuts, which include the cuts proposed by the invention, the direction of the phase velocity corresponds to the x'-axis on account of $\lambda = \theta = 0°$. Since the latter is a two-fold crystallographic symmetry axis in GaPO4, group velocity will also be in x'-direction, its magnitude having an extreme value in this area. This leads to two favorable results, i.e., no beam steering, and low sensitivity to misalignment relative to $\theta$.

The fact that simple rotated cuts are involved will considerably facilitate orientation and cutting of the crystal element, in particular in mass fabrication.

Figure 1:
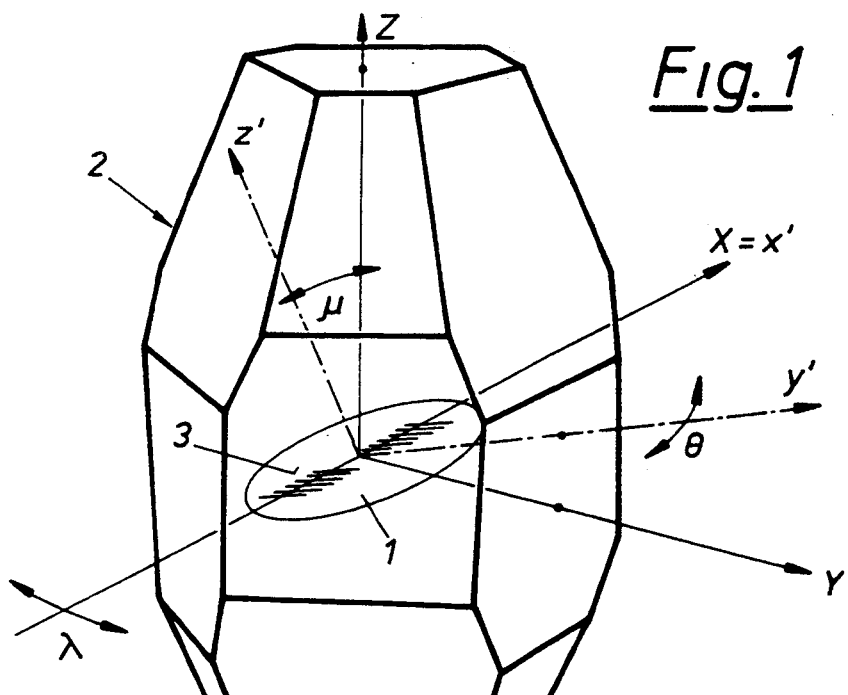
FIG. 1 shows the position of a piezoelectric crystal element of the invention in a $GaPO_4$ crystal.
Figure 2:
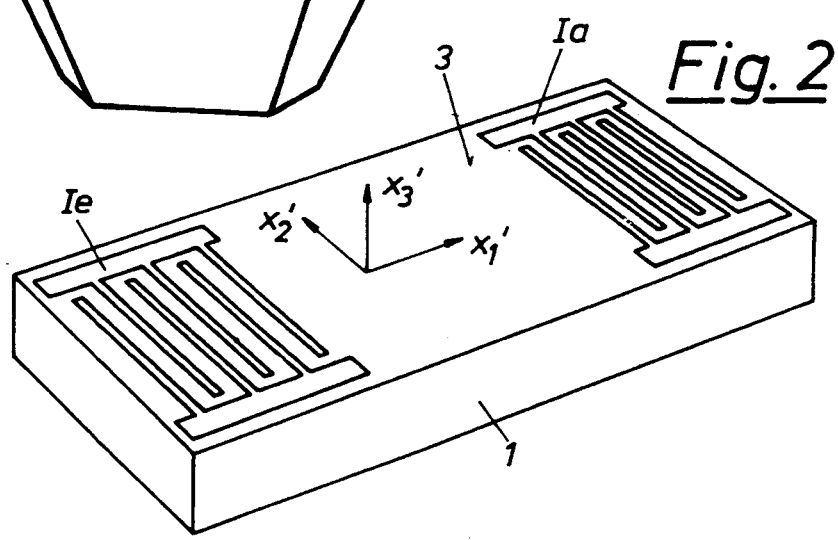
FIG. 2 shows a crystal element of the invention with a surface acoustic wave filter.

The invention may be employed mainly in the frequency range of 30 MHz to 3 GHz for numerous electronics applications. A simple example is a transversal filter (FIG. 2), where two interdigital transducers (Ie, Ia) are applied on the planar surface 3 of the piezoelectric crystal element 1. Via piezoelectric coupling an electric signal at the input transducer Ie excites a surface acoustic wave in the substrate. This wave moves along the surface 3 towards the output transducer Ia, where it generates the electric output signal. By variation of the transducer the pass characteristics of the filter can be optimized.

Figure 3:
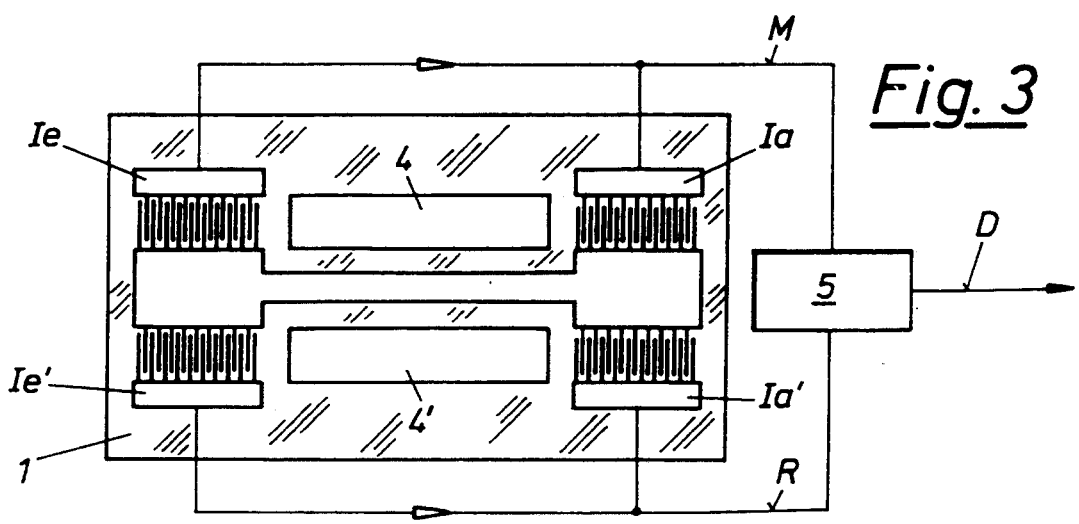
FIG. 3 is a schematic of a chemical sensor based on a piezoelectric crystal element as in FIG. 2.

Another possible application of the invention is with a chemical sensor based on SAW. Such an arrangement is shown in FIG. 3, for example. In this instance the area between or near the transducers Ia, Ie is coated with a selectively absorbing layer 4. The measuring frequency M and the reference frequency R derived from a reference arrangement (transducers Ie', Ia' reference layer 4') are transmitted to a signal processing unit 5, where a differential frequency D is obtained as the actual measuring signal. The mass load on the surface due to absorption will change the phase shift between input and output signal. With the use of an oscillator circuit it will therefore be possible to measure the concentration of gases, for example. Due to its high temperature stability a sensor with a GaPO4 substrate may be operated or cured at temperatures of up to 900° C.

To reduce wave attenuation and parameter variations the use of zone-purified crystal material is recommended, i.e., preferably from the growth zone of the (0001)-face of the raw crystal block 2. In addition, infrared absorption in the 3 $\mu$m wave range, which is used as a reference indicating the concentration of OH imperfections, should be as low as possible.

Depending on the temperature range the angle $\mu$ in the range cited above should be chosen such that the temperature dependence of delay time and center frequency is as small as possible. The most relevant ranges are the standard ranges for industrial (20° to 85° C.) and military ($-55°$ C. to 125° C.) specifications, as well as other ranges up to high temperatures for sensor applications, for example, 20° C. to 900° C. In the temperature range of interest the difference between maximum and minimum of delay time should preferably be at a minimum for the angle chosen.

Although SAW elements have been described before whose center frequencies are characterized by a significant temperature dependence, thus permitting fabrication of temperature sensors (cf. F. Möller and J. Kuhn, Sensors and Actuators A, 30 (1992), 73–75), the use of GaPO4 as a substrate and the cutting angles indicated in claim 6 of this description will offer the advantage of extending the measuring range to 900° C.

We claim:

1. A piezoelectric crystal element with at least one substantially planar surface, to be used in surface acoustic wave devices, wherein said piezoelectric crystal element is made from GaPO4 and wherein said planar surface is defined by Euler angles $\lambda$ in the range of 0°, $\mu$ in the range of 40° to 75° and $\theta$ in the range of 0°.

2. A crystal element according to claim 1, wherein angle $\mu$ is in the range of 50° to 60°.

3. A crystal element according to claim 1, comprising interdigital transducers, wherein a product of period length of said interdigital transducers and center frequency of said surface acoustic wave device is between 2,250 and 2,400 $\mu$m MHz.

4. A crystal element according to claim 1, wherein said crystal element is essentially configured as a wafer.

5. A crystal element according to claim 3 wherein said crystal element is essentially configured as a wafer.

6. A crystal element according to claim 1, wherein said crystal element is part of a chemical sensor and is covered entirely or partially by a sensitive layer.

7. A crystal element according to claim 6, wherein said crystal element is also covered by a reference layer.

8. A crystal element according to claim 6, wherein said sensitive layer is heat resistant up to 900° C.

9. A crystal element with at least one substantially planar surface, to be used for temperature measurement, wherein said piezoelectric crystal element is made from GaPO4 and said planar surface is defined by Euler angles $\lambda$ in the range of 0°, $\mu$ in the range of 90° to 130°, and $\theta$ in the range of 0°.

* * * * *